(12) United States Patent
Myrick et al.

(10) Patent No.: US 9,418,181 B2
(45) Date of Patent: Aug. 16, 2016

(54) SIMULATED INPUT/OUTPUT DEVICES

(71) Applicant: Apple Inc., Cupertino, CA (US)

(72) Inventors: Andrew D. Myrick, San Francisco, CA (US); John E. Kelley, San Francisco, CA (US)

(73) Assignee: Apple Inc., Cupertino, CA (US)

(*) Notice: Subject to any disclaimer, the term of this patent is extended or adjusted under 35 U.S.C. 154(b) by 616 days.

(21) Appl. No.: 13/737,927

(22) Filed: Jan. 9, 2013

(65) Prior Publication Data
US 2014/0195217 A1 Jul. 10, 2014

(51) Int. Cl.
*G06F 17/50* (2006.01)

(52) U.S. Cl.
CPC .................... *G06F 17/5009* (2013.01)

(58) Field of Classification Search
None
See application file for complete search history.

(56) References Cited

U.S. PATENT DOCUMENTS

| | | | |
|---|---|---|---|
| 6,769,622 B1* | 8/2004 | Tournemille | G06F 17/5022 235/492 |
| 7,111,086 B1* | 9/2006 | Ecoleston | G06F 13/4278 709/232 |
| 7,424,416 B1* | 9/2008 | Cavanagh | G06F 17/5027 703/13 |
| 7,478,180 B1* | 1/2009 | Li | G06F 13/105 703/23 |
| 7,660,937 B2 | 2/2010 | Frantz et al. | |
| 7,881,919 B2 | 2/2011 | Trumble et al. | |
| 8,365,168 B1* | 1/2013 | Kodorkin | G06F 9/45558 718/1 |
| 2006/0069543 A1 | 3/2006 | Sajwani et al. | |
| 2009/0063120 A1 | 3/2009 | Babinsky et al. | |
| 2011/0022812 A1* | 1/2011 | van der Linden | G06F 9/5077 711/163 |
| 2013/0151653 A1* | 6/2013 | Sawicki | G06F 15/17331 709/216 |

OTHER PUBLICATIONS

Wilkes, John. The Pantheon storage-system simulator. Technical report, Storage Systems Program, Hewlett-Packard Laboratories, Palo Alto, CA, Dec. 29, 1995.*
Binkert, Nathan L., et al. "The M5 simulator: Modeling networked systems." IEEE Micro 4 (2006): 52-60.*
Ganger, Gregory Robert. System-oriented evaluation of I/O subsystem performance. Diss. University of California, San Diego, 1995.*
Using the Device Simulation Framework for Software Simulation of USB Devices, Peter Shier, Windows Device Experience Group, Microsoft Corporation, Microsoft WinHEC 2006.*
Henftling, Renate, et al. "Re-use-centric architecture for a fully accelerated testbench environment." Proceedings of the 40th annual Design Automation Conference. ACM, 2003.*
Disclosed Anonymously "Method for remote register model emulation" IP.com No. IPCOM000012449D, Electronic Publication May 7, 2003, pp. 1-4.

* cited by examiner

*Primary Examiner* — Omar Fernandez Rivas
*Assistant Examiner* — Bijan Mapar
(74) *Attorney, Agent, or Firm* — Downey Brand LLP (57) ABSTRACT

In one or more embodiments, methods and apparatus are provided for simulating device communications such as those of the Universal Serial Bus ("USB") or the like. The methods and apparatus involve receiving host requests that represent commands in a communication protocol and are associated with communication endpoints, distributing the host requests across the communication endpoints in the order that they are received, to their associated endpoints to generate a distribution of requests, generating a reordered plurality of host requests by selecting the host requests from the communication endpoints in an order based upon the order in which the requests are received and one or more simulation factors, receiving device requests from a simulated device in accordance with the communication protocol, merging the reordered host requests and the plurality of device requests to form a merged sequence of requests, and performing commands from the merged sequence of requests in the order.

20 Claims, 7 Drawing Sheets

SIMULATED INPUT/OUTPUT DEVICES

TECHNICAL FIELD

The present invention relates generally to simulation of hardware devices. More particularly, the present embodiments relate to emulation techniques that cause simulated input/output devices to appear as ordinary hardware devices in a computer system.

BACKGROUND

Computer systems access peripheral input/output devices such as keyboards, printers, removable data storage, microphones, audio speakers and the like using interface protocols that provide for communication with the devices. The devices can be physically connected to the computer system using a cable or other wired connection over which input data from the peripheral and/or output data to the peripheral is transferred. Examples of these interface protocols include Universal Serial Bus (USB), FireWire (IEEE 1394), the Thunderbolt bus provided by Apple® Inc., and PCI Express®.

The process of designing, implementing, and testing new hardware and software, such as computer systems, peripherals, mobile devices, and other types of devices, and the associated software such as operating systems and device drivers, can involve the use of simulations of the devices being developed. For example, as a component for a computer system, such as a System on a Chip (SOC), is being developed, the hardware design is represented as data that includes the parts or devices used in the design, along with interconnections between and physical parameters of the devices. This representation can be used by a simulator that models the behavior of the parts or devices. The simulator can model the operation of the hardware device, performing simulated actions in a computer system running the simulator, so that the simulated actions and their results can be monitored and compared against expected actions and results to determine whether the design of the hardware device operates correctly. Simulators can use highly detailed representations of the hardware device, e.g., modeling each transistor or gate in the chip that will be produced, in which case the simulation performs at a relatively slow speed because of the large number of operations performed by the computer system to model the device. Other simulators can use less-detailed representations, such as higher-level simulations that model the behavior of the components in the hardware with less detail, and potentially less accuracy, but perform the simulations more quickly than more detailed simulators. In some cases, certain portions of the device are not simulated, e.g., because no simulator for or representation of those potions of the device is available, or simulation of those portions is difficult. In such cases, the device can be modeled as a black box that processes input and generates output, without accurate timing behavior or interaction with other portions of the simulation. Actual hardware devices such as prototypes implemented as Field-Programmable Gate Arrays (FPGAs) can also be used as simulators in place of or in combination with software simulators, in which case portions of the simulation that are not available in software can be provided by hardware models or actual hardware (e.g., actual peripheral devices) that interface with the hardware and/or software models to provide a complete simulation. However, hardware models can be expensive and difficult to debug, because, for example, they do not necessarily provide detailed information about each step of the simulation or fine control such as stepping through the simulation at a desired level of detail.

SUMMARY

New hardware designs for computer systems, peripheral devices, and other electronic devices are often simulated as part of their development and testing. Such hardware simulations can be implemented using software that runs on existing hardware to perform the same or similar operations as the new hardware design, e.g., by executing a simulator program with a computer readable representation of the hardware design as input. It is desirable to include USB communication in the simulation, e.g., so that the simulated device can have a simulated USB interface. The simulator provides a simulation of USB communication between the simulated device and a host computer, so that the host system can communicate with the simulated USB interface of the simulated device, and the simulated device appears as an ordinary USB device to the host.

In one or more embodiments, the USB simulator includes a Remote USB Daemon (RUSBD) that communicates with a corresponding device driver located in a host operating system, a simulated USB device, and a Remote USB Interface that acts as an intermediary between the device driver/RUSBD side and the simulated USB device. The Remote USB Interface uses a synchronization structure to coordinate access to shared state in the memory of the simulator machine while providing an accurate simulation of USB protocol behavior. During a simulation, the host USB controller, represented by the RUSBD, sends USB traffic over the simulated USB connection to a hardware simulator, which receives this USB traffic at the Remote USB Interface and reads and updates the state of the simulated USB device accordingly. Concurrently, the hardware simulator simulates the hardware controller and reads and updates the simulator state on behalf of the simulated USB device.

BRIEF DESCRIPTION OF THE DRAWINGS

The included drawings are for illustrative purposes and serve only to provide examples of possible structures and arrangements for the disclosed inventive apparatuses and methods for providing portable computing devices. These drawings in no way limit any changes in form and detail that may be made to the invention by one skilled in the art without departing from the spirit and scope of the invention. The embodiments will be readily understood by the following detailed description in conjunction with the accompanying drawings, wherein like reference numerals designate like structural elements, and in which.

DETAILED DESCRIPTION

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

New hardware designs for computer systems, peripheral devices, and other electronic devices are often simulated as part of their development and testing. Such hardware simulations are implemented using software that runs on existing hardware to perform the same or similar operations as the new hardware design, e.g., by executing a simulator program with a computer readable representation of the hardware design as input. It is desirable to include USB communication in the simulation, e.g., so that the simulated device can have a simulated USB interface. The simulator provides a simulation of USB communication between the simulated device and a host computer, so that the host system can communicate with the simulated USB interface of the simulated device, and the simulated device appears as an ordinary USB device to the host.

Simulations are useful for observing the behavior of the hardware design prior to availability of the hardware itself, and provide access to details of operation, such as step-by-step state and data flow, that can be difficult to determine from actual hardware. Simulation often focuses on the device being developed, such as a central processing unit, with input/output to and from the device being external to the simulator. For example, a simulator can simulate the hardware of a mobile device such as an IPhone®, and the software that runs on the mobile device, e.g., the IOS® operating system can be run on the simulator. Host devices such as desktop and laptop computers can communicate with peripheral devices such as keyboards, mice, storage media, microphones, and the like, via protocols such as USB, FireWire, Thunderbolt, and the like. Existing simulators do not include simulations of protocols capable of interacting with the host computer.

If a software-based simulator is not available for a particular subsystem, the functions of that subsystem can be performed by hardware that communicates with the simulated device. However, such hardware solutions can be expensive and inconvenient, and lack the benefits of a software simulator, such as controlled execution and state. Embodiments of the invention described herein provide software-based simulators for input/output subsystems, such as a USB simulator, that can be used with other simulators to form a more complete simulation of a hardware device.

In one or more embodiments, the USB simulator includes a Remote USB Daemon (RUSBD) that communicates with a corresponding device driver located in a host operating system, a simulated USB device, and a Remote USB Interface that acts as an intermediary between the device driver/RUSBD side and the simulated USB device. The Remote USB Interface uses a synchronization structure to coordinate access to shared state in the memory of the simulator machine while providing an accurate simulation of USB protocol behavior. During a simulation, the host USB controller, represented by the RUSBD, sends USB traffic over the simulated USB connection to a hardware simulator, which receives this USB traffic at the Remote USB Interface and reads and updates the state of the simulated USB device accordingly. Concurrently, the hardware simulator simulates the hardware controller and reads and updates the simulator state on behalf of the simulated USB device.

In one or more embodiments, the USB simulator models USB protocol behavior, e.g., the parallelism that occurs with multiple hardware devices, using a synchronization structure that schedules accesses to the simulator state requested by the Remote USB Interface and the hardware simulator as they execute concurrently with each other. Simulated USB packets are associated with simulated endpoints, so the simulated USB packets are sent to their corresponding endpoints, and the endpoint communication is allowed to proceed in parallel. Since the host requests 203 are distributed across their corresponding endpoints in parallel (e.g., by concurrent threads), the order in which the host requests 203 are received at the simulated USB registers accurately models the order and/or pattern in which host requests 203 can be received by an actual USB controller. Furthermore, since the host requests 203 are merged with the hardware simulator's internal requests 203 to access the registers, the order in which USB register access requests 203, 227 are performed on the state accurately models the order and/or pattern in which host and controller requests can be performed in an actual USB controller.

Figure 1:
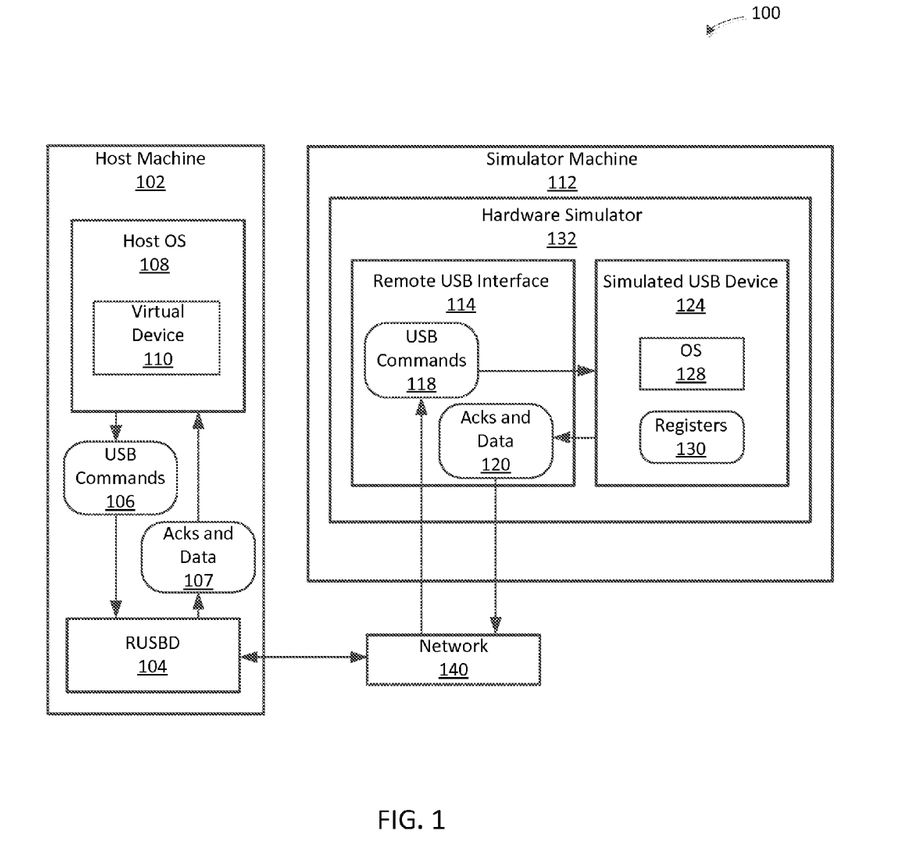
FIG. 1 is a representative diagram showing components of a simulator system in accordance with one or more embodiments.

FIG. 1 is a representative diagram showing a simulation system 100 in accordance with one or more embodiments. The simulation system 100 includes a host machine 102, e.g., a desktop computer or other computer system, which executes a host operating system 108 in which a virtual USB device 110 is created. The virtual USB device 110 appears to applications running on the host operating system as an ordinary USB device that can generate USB commands 106 and can receive USB acknowledgements and/or data 107. However, the USB commands 106 generated by the virtual device 110 are received by a Remote USB Daemon (RUSBD) module 104, which sends them to a hardware simulator 132 via a communication network 140. The RUSBD 104 can be, for example, a server process, e.g., a daemon, that executes on the host machine 102. The virtual device 110 communicates with the RUSBD 104 through a USB Device Interface, i.e., a User Client (not shown). A Remote USB Interface 114 module of the hardware simulator 132 executing on a simulator machine 112 receives the commands via the network 140 as USB commands 118, and sends the USB commands 118 to a simulated USB device 124 provided by the hardware simulator 132.

The hardware simulator 132 can be, for example, a simulation of a device that uses, i.e., communicates using, the USB protocol, such as an IPhone®, tablet computer, printer, or other type of simulated computing device or peripheral. The hardware simulator 132, can be located on and executed by the simulator machine 112 such as a desktop or server computer system. The simulated USB device 124 executes a simulated operating system 128, e.g., IOS® or the like, and includes simulated USB registers 130 through which the simulated device 124 communicates USB commands and data to and from the Remote USB Interface 114. The hardware simulator 132 can be executed using a software-based hardware simulator, e.g., a computer program that simulates the operation of the hardware specified in the simulated device 124. The simulated device 124 can simulate a device having one or more USB ports using. e.g., an ARM architectural level IPhone® simulator. The hardware simulator 132 can be, for example, a software-implemented hardware simulator that simulates system-on-a-chip (SOC) execution at an architectural/instruction level, register-transfer level, or net list level, and is capable of interacting with external devices and device simulation libraries. The hardware simulator 132 may be based on, for example, the EVE or Palladium simulator, or the like. Thus, the hardware simulator 132 can be any level of simulator. As described above, the hardware simulator 132 uses the simulated USB device 124 to simulate the operation of a USB device for the received USB commands 118. The simulated USB device 124 can generate acknowledgements and/or data 120, which the Remote USB Interface 114 sends back to the host machine 102 via the network 140. The RUSBD module 104 on the host machine 102 receives and forwards the acknowledgements and/or data 107 to the virtual device 110, which provides the data to the host operating system 108.

In one or more embodiments, the Remote USB Interface 114 shown on the simulator machine 112 in FIG. 1 provides an interface between the RUSB daemon (RUSBD) 104 and the simulated USB device 124 that simulates USB hardware of the device. The Remote USB Interface 114 interprets and translates USB commands 118 sent from the RUSB daemon 104 to the Remote USB Interface 114 and, in the reverse direction, acknowledgements and/or data 120 from the device operating system 128 running on the simulated USB device 124 to RUSB protocol packets that are sent to the RUSB daemon (RUSBD) 104 running on the host system 102. In one or more embodiments, the RUSB protocol is a packet-oriented protocol analogous to a control layer of the USB protocol. The RUSB protocol may, for example, combine multiple USB protocol messages into a single packet for more efficient communication and processing. The single packet can be split into multiple USB messages at the receiving end. In one aspect, the Remote USB Interface 114 corresponds to the device-side PHY, and interprets RUSB packets into USB-level packets.

In one or more embodiments, as described above, the RUSB daemon 104 uses a communication protocol, referred to herein as the RUSB protocol, that transfers data in the form of RUSB packets via network sockets over a network 140 or other interprocess communication mechanism. The RUSB daemon 104 sends USB commands 106 generated by the virtual device 110, receives responses, such as the acknowledgements and/or data 107, and forwards the responses to the virtual device 110. Although the components are shown as being distributed across multiple machines, i.e., the host machine 102 and the simulator machine 112, in another embodiment, the components can alternatively be located and executing on a single machine, such as the host machine 102. Thus, in another embodiment, the hardware simulator 132 can be located on the host system 102 instead of on the simulator machine 112, in which case the RUSB daemon 104 interacts with the hardware simulator 132 using inter process communication, e.g., Unix domain sockets, or the like. The hardware simulator 132 can be located remotely, as shown in FIG. 1 to, for example, distribute the computational workload of the simulation to one or more simulator machines 112 that have more computing resources than the host system 102. The ability to use two or more machines provides flexibility and distribution of workload. When using multiple machines, communication can be based on TCP/IP, or another appropriate protocol across the network 140, with RUSB protocol packets being sent across a TCP/IP connection.

In one or more embodiments, for incoming acknowledgements and/or data 107, the RUSB daemon 104 receives RUSB protocol representations of the acknowledgements and/or data 120 from the Remote USB Interface 114, translates the acknowledgements and/or data from the RUSB protocol to USB protocol acknowledgements and/or data 107 compatible with the host system's USB stack, and multiplexes the translated acknowledgements and/or data 107 onto one or more virtual devices 110 instantiated on the operating system 108 of the host 102. The RUSB daemon 104 communicates with the kernel of the operating system 108 and causes RUSB Family drivers to be instantiated. The RUSB Family drivers provide the virtual USB device(s) 110, and can be one or more device drivers that interpret the USB acknowledgements and/or data 107 sent from the RUSBD 104 into USB transactions on the operating system of the host 102. The RUSB Family drivers present the same interface to the host operating system 108 as a physical device would, so that applications executing on the host operating system 108 can send and receive data to and from the simulated USB device 124 by writing commands to and reading data from the corresponding USB device interface on the host machine 102. Thus, the virtual device 110 appears as a USB device to other host tools or applications, such as ITunes® or other applications that execute on the host machine 102 and access USB devices through the host operating system 108.

In one or more embodiments, there can be multiple hardware simulators 132 and/or simulated devices 124 communicating with a single RUSB daemon 104, in which case the RUSB daemon 104 can act as a multiplexer from the multiple hardware simulators 132 and/or simulated devices 124 to the virtual USB devices 110.

Figure 2:
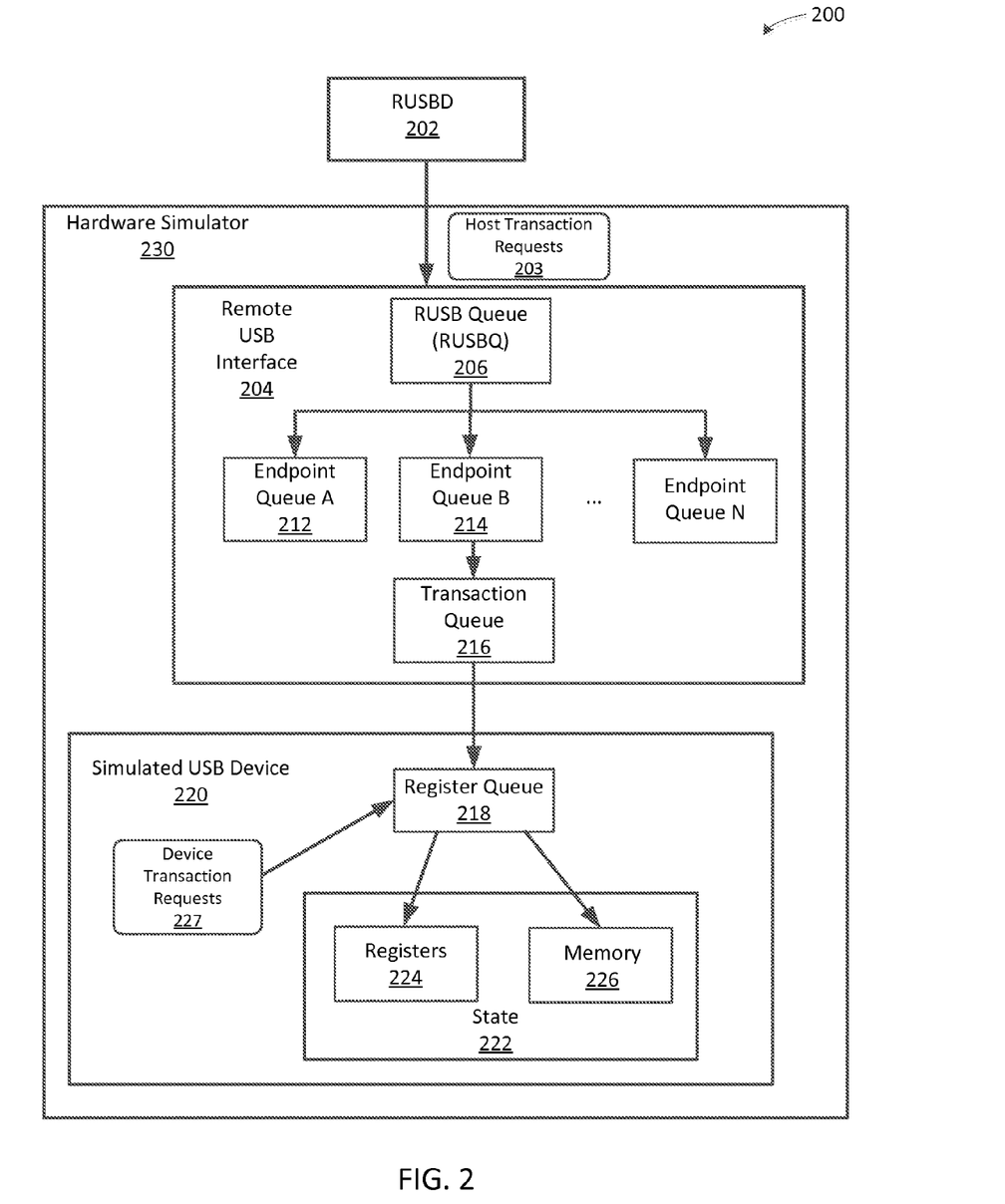
FIG. 2 is a representative diagram showing a USB simulator in accordance with one or more embodiments.

FIG. 2 is a representative diagram showing a USB simulator 200 in accordance with one or more embodiments. The USB simulator 200 includes an RUSBD 202, a hardware simulator 230. The hardware simulator 230 includes a Remote USB Interface 204, and a simulated USB device 220. USB commands, e.g., host transaction requests 203, flow between the RUSBD 202 and the simulated USB device 220 through the Remote USB Interface 204, which uses a synchronization structure to coordinate access to the simulated USB device's shared state 222 in the memory of the simulator machine 112 while providing an accurate simulation of USB protocol behavior. In USB terms, the RUSBD 202 corresponds to the host USB controller and the host PHY. The network 140 corresponds to the USB cable or link. The remote USB interface 204 corresponds to the device PHY. The correspondence between the simulator components and the USB system model is shown in more detail in FIG. 3. The RUSBD 202 and the simulated USB device 220 can be understood as agents that modify the simulator state 222, which includes USB registers 224 and system memory 226. During a simulation, the host USB controller, represented by the RUSBD 202, sends USB traffic over the USB connection to the simulated USB model, which receives this USB traffic at the Remote USB Interface 204 and reads and updates the simulator state 222 accordingly. Concurrently, the simulated USB device 220 simulates the hardware controller and reads and updates the simulator state 222 on behalf of the simulated USB device 220.

In one or more embodiments, the USB simulator models USB protocol behavior. A single device can have many endpoints, and this parallelism is exposed by one or more devices. The USB simulator models the parallelism in the USB protocol using a synchronization structure that schedules accesses to the simulator state 222 requested by the Remote USB Interface 204 and the simulated USB device 220 as they execute concurrently with each other. USB packets are associated with endpoints, so the simulated USB packets are sent to their corresponding endpoints, and the endpoint communication is allowed to proceed in parallel.

In one or more embodiments, the USB commands 118 are received by the Remote USB Interface 204, which enqueues the packets onto an RUSB queue (RUSBQ) 206, e.g., a queue of requests 203. A thread of execution performs the task of receiving and enqueuing packets on the RUSBQ 206. One or more dispatcher threads, which can run in multiple concurrent tasks or threads of execution, dequeue packets from the RUSBQ, and enqueue each packet on an endpoint queue (EPq) 212, 214 that corresponds to the packet. In one example, there is a dedicated endpoint queue for each endpoint in the system, and the packets identify the endpoints to which the packets are directed. The particular endpoint queue that corresponds to a packet can be indicated by a data value stored in or associated with the packet. A write transaction can be split into a sequence of smaller packets (e.g., OUT packets, data packets up to 1024 bytes in size), which are to be sent sequentially.

Each of the endpoint queues feeds transactions, e.g., requests 203 to access shared state 222, into a transaction queue 216, and those transactions occur atomically. For example, one read or write operation accessing the state 222 is executed at a time. When a write transaction is inserted into the transaction queue, the simulator atomically executes the OUT packet and as many data packets as are needed. These packets can be fed into the register queue 218 one at a time. In one aspect, an endpoint queue 212 does not enqueue a transaction until a corresponding endpoint control register in the simulated registers 224 indicates that the endpoint is capable of receiving data. The endpoint queues 212, 214 are aware of the register state of the simulated USB device 220 and ask the controller if it is capable of receiving a transaction on a particular endpoint. If so, the endpoint will perform a transaction to send data.

In one or more embodiments, the simulator 230 simulates a form of nondeterminism that is present in the USB protocol at certain points at which transactions, such as memory access requests 203 or other operations, can occur in different orders or at different times. The particular order in which such transactions are executed by the simulator is determined by simulation factors such as the USB interface configuration (e.g., number of enabled endpoints) and simulation factors that are effectively random, such as the selection of which endpoint is processed at a particular time when multiple endpoints are ready (and consequently the order in which endpoints are selected). The order in which transactions are processed can also depend on which endpoint is processed first, as well as the timing and distribution of the requests 203 received from the host. The times at which the host requests 203 are retrieved from the endpoint queues are also simulation factors that can determine the order in which the requests 203 are added to the transaction queue 216 and subsequently dequeued from the transaction queue 216, enqueued to the register queue 218, and executed.

Access requests 203 from the RUSBD 202 are dequeued from the endpoint queues 212, 214 and enqueued on a transaction queue 216 by one or more endpoint threads. If there are multiple endpoint threads, the order in which requests 203 are enqueued on the transaction queue can depend on a number of simulation factors in a way that simulates the nondeterminism present in the processing of requests in actual devices according to the USB protocol.

The endpoint threads can execute concurrently, so the endpoint threads can dequeue requests from the endpoint queues 212, 214 concurrently, with distinct endpoint threads dequeueing requests 203 from distinct endpoint queues. Thus, the requests 203 can be dequeued from the endpoint queues by the threads in a nondeterministic order, because the threads execute independently of each other without explicit synchronization. The order in which requests 203 are dequeued from the endpoint queues 212, 214, and consequently, the order in which requests 203 are enqueued on the transaction queue 216, is based on simulation factors such as the number of endpoint queues that are capable of receiving data, the relative times at which the packets are enqueued on the endpoint queues 212, 214, and the relative execution speeds of the threads that are dequeueing the requests 203 from the endpoint queues 212, 214. In one aspect, these factors influence the outcome of a "race" among the requests 203 to reach the transaction queue 216 and, subsequently, to the register queue 218 and to access the shared state 222. In one aspect, the host requests 203 are passed from the transaction queue 216 to the register queue 218 without being reordered, so the host requests 203 in the register queue 218 are ordered according to the same factors described above for the transaction queue 216, although the host requests 203 in the register queue 218 can be separated by device requests 227, as described below.

Access requests 227 from the simulated USB device 220 are enqueued on the register queue 218 as part of the simulation of the USB device. The register queue 218 merges the requests 227 from the simulated USB device 220 with the requests 203 received from the RUSBD 202, so that the requests 203 in the register queue 218 are ordered by the times at which they are enqueued on the register queue 218.

Thus, transactions such as requests to access, e.g., read and/or write, shared state such as registers 224 and memory 226 are generated by the two sources described above: the RUSBD 202, which receives state access requests 203 from a host, and the simulated USB device 220, which generates device state access requests 227 as part of the simulation of the USB device. The results of the accesses, if any, e.g., data that has been read, are returned to the source in responses.

The serialization of the combination of the state accesses from the host via the RUSBD 202 and the state accesses from the simulated device 220 by the register queue 218 models the mixture of such accesses in an actual USB device. Thus, in one aspect, the device requests 203, 227 in the register queue 218 are ordered by the times at which the device requests 203, 227 are removed from the endpoint queues 212, 214 and enqueued on the transaction queue 216. Alternatively, in other embodiments, locks can be used in place of queues, with the simulated USB device 220 requesting and releasing a lock on the shared state 222, and the requests from the simulated USB device 220 being performed when the lock is acquired.

In one or more embodiments, host requests 203 are dequeued from the transaction queue 216 and enqueued on a register queue 218, from which the requests 203 are subsequently dequeued sequentially and permitted to perform their state access operations, e.g., read, write, and/or read/write operations, on the state 222 in the order in which they appear in the register queue 218. The requests 203 dequeued from the transaction queue 216 can be either host requests 201 originated by the host USB controller or simulator state access requests 227 originated by the simulated USB device 220. In one aspect, one state access request 203, 227 at a time is dequeued from the register queue 218 and performed on the state 222. Thus the register queue 218 merges or interleaves the requests 203 from the host with the requests 227 from the simulated USB device 220. Since the host requests 203 have been distributed across their corresponding endpoints in parallel (e.g., by concurrent threads), and the order in which the host requests 203 are received at the register queue 218 accurately models the order and/or pattern in which host requests can be received by an actual USB controller. Furthermore, since the host requests 203 are merged with the simulated USB device's requests 227 by the register queue 218, the order in which register (and/or memory) access requests are performed on the state 222 accurately models the order and/or pattern in which host and device/controller requests can be performed in an actual USB controller.

In one or more embodiments, a HANDLE_PACKET function processes each packet that is sent. When a packet is sent, data can be returned as a result from that packet by the HANDLE_PACKET function. Functions named GET_ENDPOINT_BLOCKSIZE and GET_ENDPOINT_PACKETSIZE return the block size and packet size, respectively, for a particular endpoint. For example, in a command to write 4K, there is 1 initial kOUT packet. If the packet size is 512 bytes, then 8 data packets will be sent. The block size represents the quantity of data that the controller can handle in a single write transaction. To write a larger buffer, e.g., 32 k, with a block size of 4 k, a series of transactions are generated in a loop, e.g., 8 kOUT packets, each followed by 8 data packets. That happens as a single transaction on the transaction queue, and will interact with the hardware model. When the DMA buffer becomes full, the host software will read the data out to process it, and provide a new buffer for another read. As introduced above, each endpoint queue determines whether its endpoint is capable of receiving packets. A function named IS_ENDPOINT_ENABLED is provided to determine whether an endpoint can receive packets. Each endpoint waits until it is enabled, e.g., using semaphores to wait for the state to become enabled. The simulated USB device 220 enables and disables endpoints as it is ready to receive data on them. The simulated endpoints include a control endpoint and in and out endpoints. A RESET_ENDPOINTS function is enabled to reset the system, e.g., as part of a re-enumeration event during a boot operation.

Figure 3:
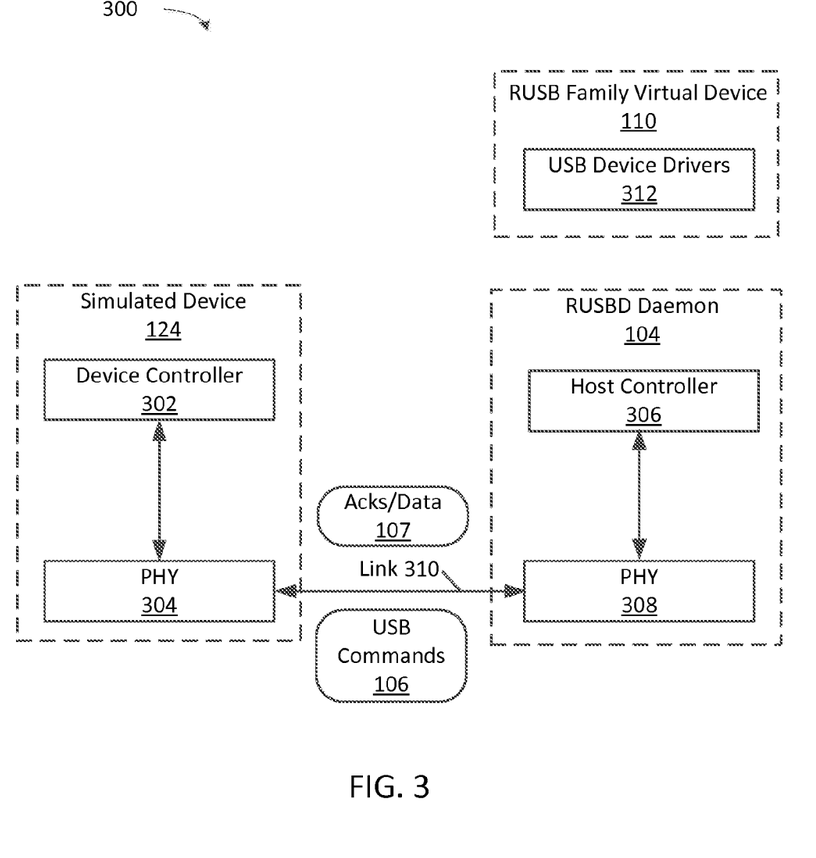
FIG. 3 is a representative diagram showing USB simulator components and corresponding physical USB components.

FIG. 3 is a representative diagram showing the USB simulator components 300. In the USB model, the simulated device 124 corresponds to a device controller 302 and a device PHY 304. The device PHY 304 is an interface between the USB communication link-level protocol and a physical medium, such as a USB cable or link 310. The device controller 302 communicates with a host controller 306 via the link 310 by sending USB acknowledgements and/or data 107 to the device's PHY 304, which transmits the acknowledgements and/or data 107 to the host's PHY 308, which provides the acknowledgements and/or data 107 to the host controller 306. USB commands 106 are sent in the opposite direction, from the host controller 306 through the PHYs 308, 304 to the device controller 302. The acknowledgements and/or data 107 and the USB commands 106 correspond to the data sent via the link 310. The RUSB daemon 104 performs USB control flow processing and corresponds to the host's PHY 308 and the host controller 306. The RUSB family drivers provide the virtual USB device 110 for host applications to communicate with the simulated device, and correspond to a USB device driver 312. The correspondence between simulated entities and physical entities is not necessarily exact or comprehensive, and is described here for illustrative purposes.

Figure 4:
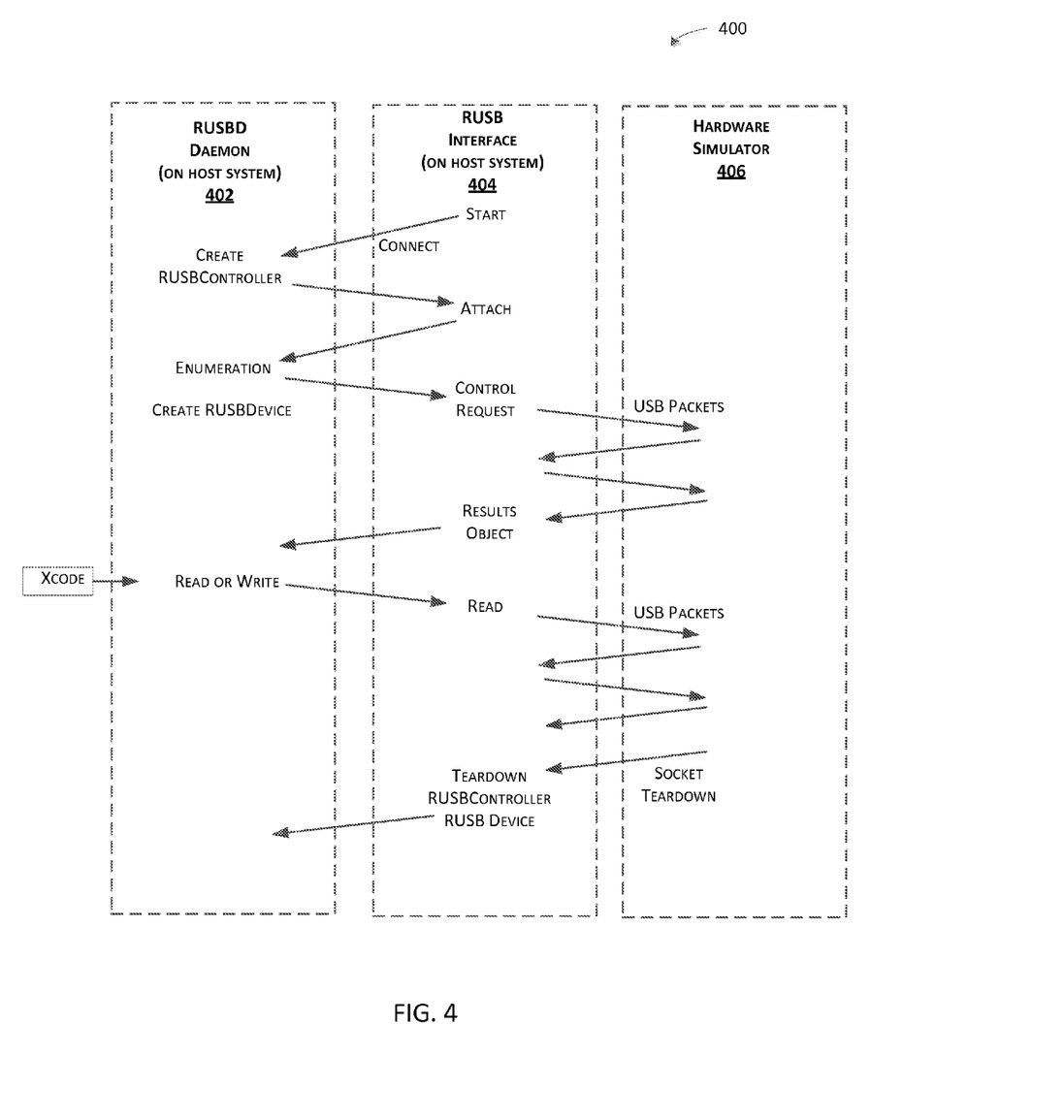
FIG. 4 is a representative interaction diagram of a USB simulator operation.

FIG. 4 is a representative interaction diagram of a USB simulator operation 400. FIG. 4 shows a sample interaction in which the RUSB Interface 404 located on a host system starts and sends a request message to find an RUSBD 402. The RUSBD 402 creates an RUSBController and sends an Attach message to the RUSB Interface 404. The RUSB Interface 404 initiates an enumeration on the RUSBD 402. Enumeration involves the host sending a series of control requests to discover the devices available in the environment. The RUSB Interface receives control messages and splits each control message into a series of transactions. That is, the RUSB simulator protocol between the RUSBD and the RUSB Interface operates as a higher level of abstraction than the USB packet level used by a hardware simulator 406. The simulator protocol may, for example, issue a request to read a certain number of byte, which may exceed the maximum USB packet size (e.g., 64 bytes or 512 bytes), thereby causing the data to be split into multiple packets. Each control request can thus be broken up into multiple USB packets, which are sent to the hardware simulator 406, e.g., a simulated hardware controller. The hardware simulator 406 sends USB packets describing itself to the RUSB Interface 404 in response. The RUSB Interface 404 sends the device description to the RUSBD 402 in a results object.

An application, e.g., Xcode, ITunes®, or the like can start an interaction by issuing a Read or Write request. In the example of a Read request, the request is sent to the RUSB Interface, which sends the request to the hardware simulator 406. The hardware simulator 406 sends the requested data back to the RUSB Interface 404, which forwards the data to the RUSBD 402. The RUSBD 402 then forwards the data to a device driver in the host operating system to satisfy the application's read request. The sockets used for communication are then closed.

Figure 5:
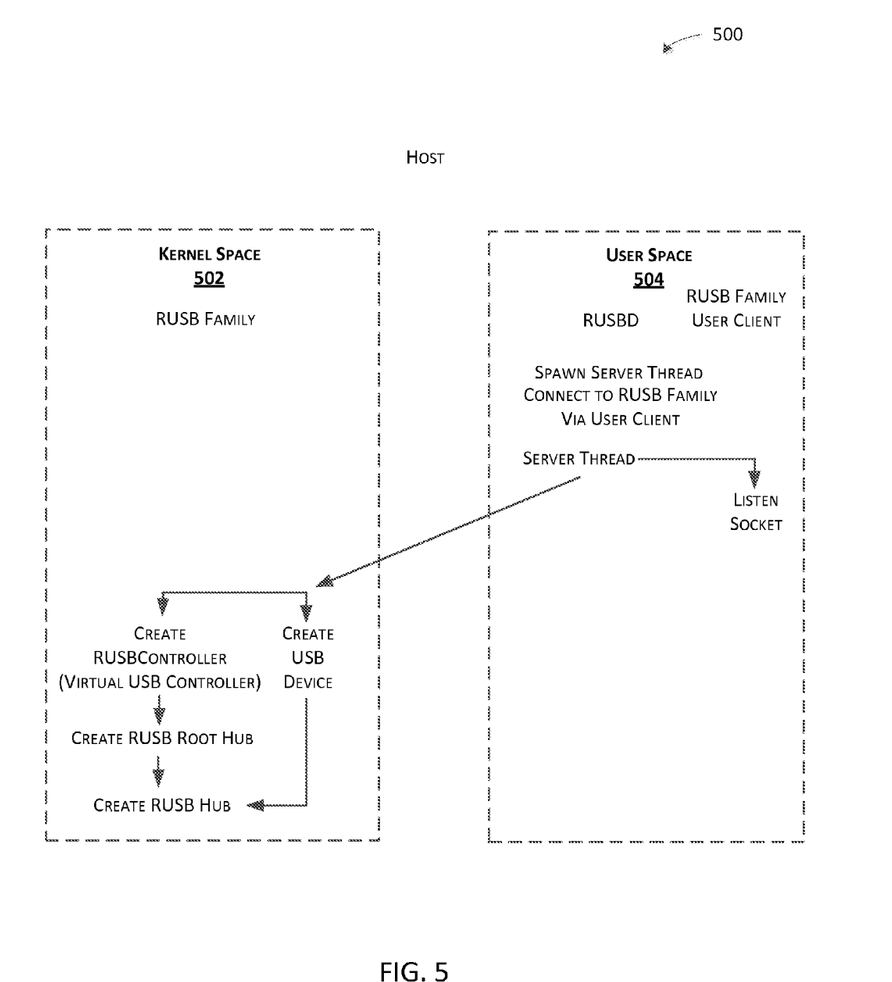
FIG. 5 is a representative interaction diagram of a host-side USB simulator operation.

FIG. 5 is a representative interaction diagram of host-side USB simulator operation 500. The operating system on a host computer provides kernel space 502, which is a portion of memory in which kernel interface components of the simulator can execute as needed to communicate with the operating system and provide the simulated USB device interface. The operating system also provides user space 504, which is a portion of memory in which other simulator components, such as the RUSBD 104 and the RUSB Family user client (which allows the RUSBD to communicate with RUSB Family kernel extension components related to the virtual device driver), can execute. For each virtual device that attaches, RUSBD 104 spawns a Server Thread. In one example, the Server Thread runs in the RUSBD 104 in user space, and is dedicated to one instance of the simulator implementation components shown in FIG. 2. The Server Thread connects to the kernel RUSB Family via the User Client, and, now executing in kernel space 502, creates an RUSB Controller. The Server Thread also creates an RUSB Root Hub and RUSB Hub, as well as a USB Device object that is attached to the RUSB Hub. The server thread then listens on the socket for incoming data. When data arrives on the socket, the protocol is parsed into RUSB commands that are sent up to the RUSB Family, which takes the protocol messages that are defined for RUSB and translates those into actual USB hardware actions.

Figure 6:
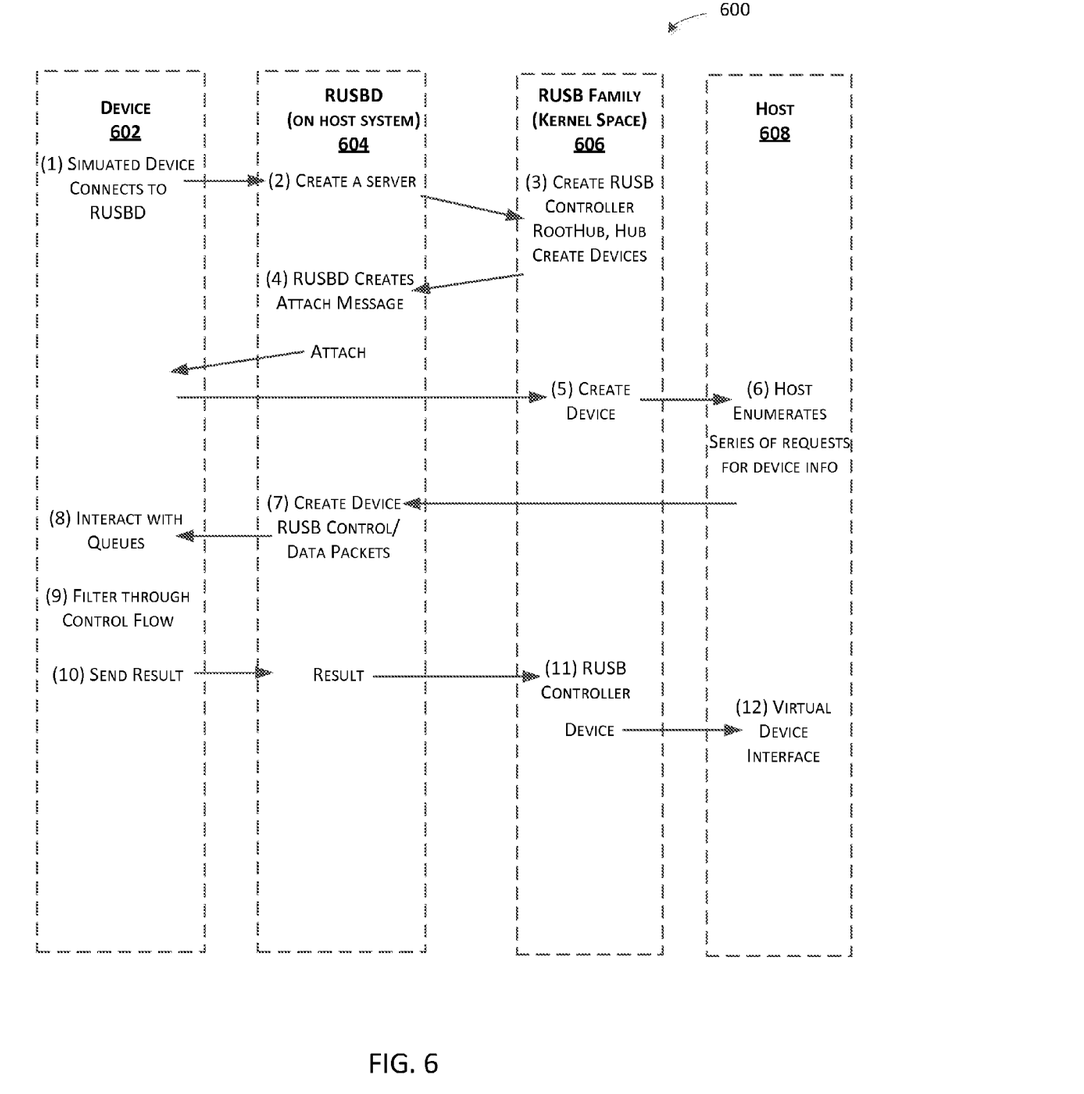
FIG. 6 is a representative interaction diagram of device-host interactions in USB simulator operation.

FIG. 6 is a representative interaction diagram of device-host interaction USB simulator operations 600. A simulated Device 602 connects to RUSBD 604 (1). RUSBD 604 then creates a server (2). RUSB Family 606 in kernel space, in response creates an RUSB Controller, Root Hub, and Hub (3). RUSBD 604 then creates an Attach message (4), which initiates creation of a Device (5). The creation of the device (5) causes a host 608 to enumerate (6), which initiates OS enumeration on the host 608 (6), which then causes an RUSB Control packet (7) to be created and interact with queues (8). A transaction filters through the control flow described in FIG. 5 (9). A result (10) is sent to RUSBD 604, which sends the result to the RUSB family device (11), which sends the result to the virtual device (12). The result is then read out by the host operating system.

Although a USB simulator has been described, the techniques described herein can be applied to simulators of other protocols, such as other protocols that interface a host system to a device, including FireWire (IEEE 1394), the Thunderbolt bus provided by Apple® Inc., and PCI Express®, variants and different versions of USB, and the like. For example, a simulator protocol analogous to the RUSB protocol can be defined to represent operations in other interface protocols, and the remote daemon (RUSBD) and Device Interface can be modified or extended to process incoming simulator protocol requests received from a host or a sending device, map the requests to operations on a simulated device, with multiple devices being modeled by the queuing structure described herein, and convert simulation state and the results of simulated operations to responses in the simulator protocol, and send the responses to the host or requesting device.

Figure 7:
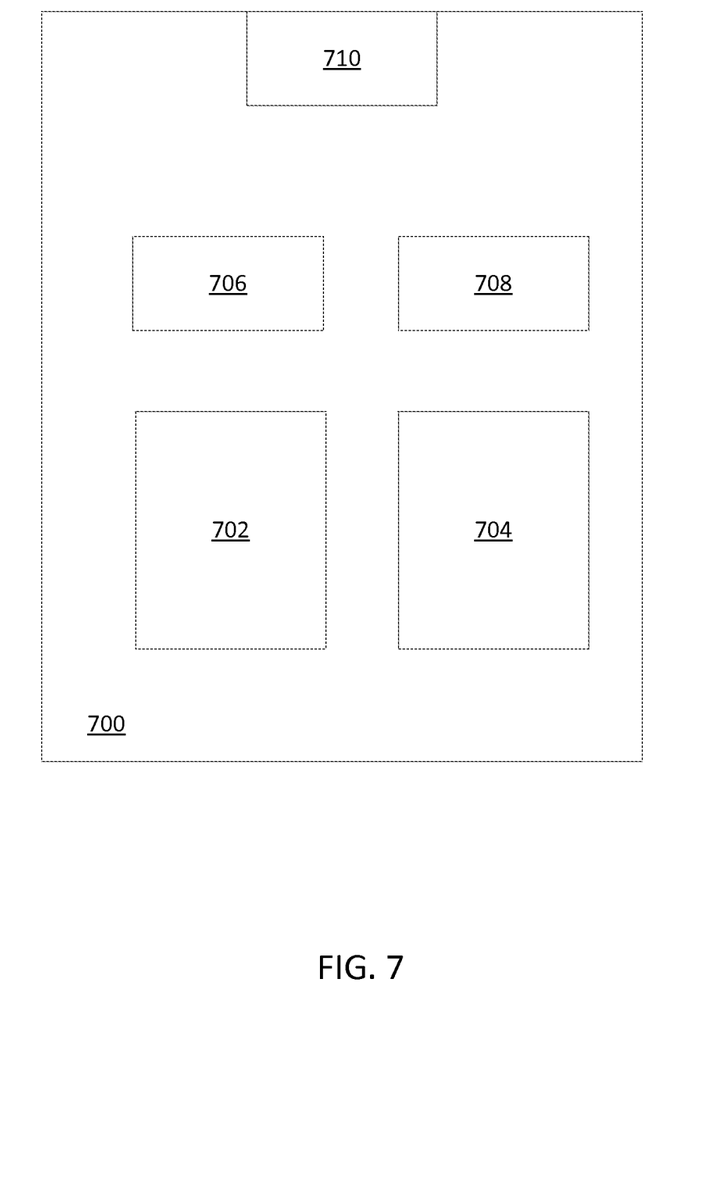
FIG. 7 shows a system block diagram of computer system used to execute the software of an embodiment.

FIG. 7 shows a system block diagram of computer system 700 used to execute the software of an embodiment. Computer system 700 includes subsystems such as a central processor 702, system memory 704, fixed storage 706 (e.g., hard drive), removable storage 708 (e.g., FLASH), and network interface 710. The central processor 702, for example, can execute computer program code (e.g., an operating system) to implement the invention. An operating system is normally, but necessarily) resident in the system memory 704 during its execution. Other computer systems suitable for use with the invention may include additional or fewer subsystems. For example, another computer system could include more than one processor 702 (i.e., a multi-processor system) or a cache memory.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A method of simulating communication between devices, the method comprising:
at a hardware simulator:
receiving, at a simulated device interface, a host request that represents a command from a host device for accessing a state register of a simulated device that is connected to the simulated device interface;
distributing the host request to a device endpoint of the simulated device interface;
generating, by simulating an operation of the simulated device, a device request for accessing the state register of the simulated device;
removing the host request from the device endpoint, wherein the receiving, generating, and removing are performed iteratively by concurrent threads;
determining a first time at which the device request is generated, and a second time at which the host request is removed from the device endpoint;
interleaving the host request and the device request into a merged sequence of requests such that, when the first time is earlier than the second time, the device request has priority over the host request; and
executing requests of the merged sequence of requests in an order in which the requests occur in the merged sequence of requests, wherein the requests include instructions for accessing state data stored by the state register.

2. The method of claim 1, wherein the simulated device is configured to provide information related to a simulated operating system on the simulated device.

3. The method of claim 1, further comprising:
splitting the host requests into packets.

4. The method of claim 1, wherein an arrangement of the merged sequence of requests is based on how many device endpoints are enabled.

5. The method of claim 3, wherein the host requests represent read or write transactions.

6. The method of claim 3, wherein the state data includes representations of registers and memory locations.

7. The method of claim 6, wherein the host requests are distributed simultaneous to the execution of requests of the merged sequence of requests.

8. The method of claim 1, wherein removing the host request from the device endpoint comprises determining whether the device endpoint is capable of receiving data.

9. The method of claim 1, wherein the host request, and device endpoint are associated with a Universal Serial Bus (USB).

10. A computing device comprising:
a processor:
a memory configured to store instructions that when executed by the processor cause the processor to perform steps that include:
receiving, at a simulated device interface, a host request that represents a command from a host device for accessing a state register of a simulated device that is connected to the simulated device interface;
distributing the host request to a device endpoint of the simulated device interface;
generating, by simulating an operation of the simulated device, a device request for accessing the state register of the simulated device;
removing the host request from the device endpoint, wherein the receiving, generating, and removing are performed iteratively by concurrent threads;
determining a first time at which the device request is generated, and a second time at which the host request is removed from the device endpoint;
interleaving the host request and the device request into a merged sequence of requests such that, when the first time is earlier than the second time, the device request has priority over the host request; and
executing requests of the merged sequence of requests in an order in which the requests occur in the merged sequence of requests, wherein the requests include instructions for accessing state data stored by the state register.

11. The system of claim 10, wherein the simulated device corresponds to a universal serial bus device that includes a simulated operating system.

12. The system of claim 10, wherein the steps further include:
determining whether any endpoints are available, and
retrieving only host requests that correspond to an available device endpoint.

13. A non-transitory computer readable medium configured to store instructions that, when executed by a processor of a computing device, cause the computing device to perform steps that include:
receiving, at a simulated device interface, a host request that represents a command from a host device for accessing a state register of a simulated device that is connected to the simulated device interface;

distributing the host request to a device endpoint of the simulated device interface;

generating, by simulating an operation of the simulated device, a device request for accessing the state register of the simulated device;

removing the host request from the device endpoint, wherein the receiving, generating, and removing are performed iteratively by concurrent threads;

determining a first time at which the device request is generated, and a second time at which the host request is removed from the device endpoint;

interleaving the host request and the device request into a merged sequence of requests such that, when the first time is earlier than the second time, the device request has priority over the host request; and executing requests of the merged sequence of requests in an order in which the requests occur in the merged sequence of requests, wherein the requests include instructions for accessing state data stored by the state register.

14. The computing device of claim 10, wherein an arrangement of the merged sequence of requests is based on how many device endpoints are enabled.

15. The computing device of claim 10, wherein the steps further include: splitting the host requests into packets.

16. The computing device of claim 10, wherein the host requests are distributed simultaneous to the execution of requests of the merged sequence of requests.

17. The non-transitory computer readable medium of claim 13, wherein the requests correspond to instructions to read from or write to the state register.

18. The non-transitory computer readable medium of claim 13, wherein an arrangement of the merged sequence of requests is based on how many device endpoints are enabled.

19. The non-transitory computer readable medium of claim 13, wherein removing the host request from the device endpoint comprises determining whether the device endpoint is capable of receiving data.

20. The non-transitory computer readable medium of claim 13, wherein the host requests are distributed simultaneous to the execution of requests of the merged sequence of requests.

* * * * *